(12) United States Patent
Unterhalt et al.

(10) Patent No.: US 9,404,978 B2
(45) Date of Patent: Aug. 2, 2016

(54) ARRANGEMENT OF AN ELECTRONIC SENSOR DEVICE AT A TERMINAL POST CLAMP OF A BATTERY AND A METHOD FOR PRODUCING SUCH AN ARRANGEMENT

(71) Applicant: Hella KGaA Hueck & Co., Lippstadt (DE)

(72) Inventors: Marco Unterhalt, Salzkotten (DE); Katrin Zimmermann, Lippstadt (DE)

(73) Assignee: HELLA KGAA HUECK & CO., Lippstadt (DE)

( * ) Notice: Subject to any disclaimer, the term of this patent is extended or adjusted under 35 U.S.C. 154(b) by 97 days.

(21) Appl. No.: 14/272,193

(22) Filed: May 7, 2014

(65) Prior Publication Data

US 2014/0333318 A1 Nov. 13, 2014

(30) Foreign Application Priority Data

May 8, 2013 (DE) .......................... 10 2013 104 756

(51) Int. Cl.
| | |
|---|---|
| *G01N 27/416* | (2006.01) |
| *H02J 7/14* | (2006.01) |
| *G01R 31/36* | (2006.01) |
| *H01R 13/62* | (2006.01) |
| *H01M 10/48* | (2006.01) |
| *H01R 11/28* | (2006.01) |

(52) U.S. Cl.
CPC ........... *G01R 31/3696* (2013.01); *H01M 10/48* (2013.01); *H01R 11/287* (2013.01); *H01R 13/62* (2013.01); *Y10T 29/49169* (2015.01)

(58) Field of Classification Search
CPC .............................. G01R 31/3696; H01R 13/62
USPC ........................................................... 324/437
See application file for complete search history.

(56) References Cited

U.S. PATENT DOCUMENTS

| | | | | |
|---|---|---|---|---|
| 6,218,805 | B1 * | 4/2001 | Melcher .............. | G01R 31/362 320/105 |
| 6,551,147 | B2 * | 4/2003 | Wakata .............. | G01R 31/3696 320/105 |
| 6,808,841 | B2 * | 10/2004 | Wakata .............. | G01R 31/3696 429/61 |
| 6,933,727 | B2 * | 8/2005 | Bertness ............ | G01R 31/3648 324/426 |
| 7,491,097 | B2 * | 2/2009 | Ishihara .............. | G01R 15/207 324/117 H |
| 7,936,165 | B2 * | 5/2011 | Matsumura .......... | G01R 15/207 324/117 H |
| 8,129,940 | B2 * | 3/2012 | Abe ..................... | H02J 7/1453 320/104 |
| 2012/0126818 | A1 * | 5/2012 | Ishihara ............. | G01R 31/3696 324/426 |
| 2013/0040177 | A1 * | 2/2013 | Hashio ................. | H01M 2/305 429/93 |

(Continued)

FOREIGN PATENT DOCUMENTS

| | | |
|---|---|---|
| DE | 102005043320 A1 | 3/2006 |
| DE | 102004053648 A1 | 5/2006 |
| DE | 102006038373 A1 | 2/2008 |

(Continued)

*Primary Examiner* — M'Baye Diao
(74) *Attorney, Agent, or Firm* — Husch Blackwell LLP

(57) ABSTRACT

An arrangement of an electronic sensor device (3) at a terminal post clamp (1) of a battery. The arrangement comprises: a terminal post clamp (1) of a battery; an electronic sensor device (3); a housing (10), which can accommodate the electronic sensor device (3); and a fastening means, which can connect the housing (10) to the terminal post clamp (1). The fastening means comprises a receptacle (13) and a fastening member (8) that can be inserted at least in sections into the receptacle (13) in a positive locking and/or non-positive locking manner.

18 Claims, 3 Drawing Sheets

(56) References Cited

U.S. PATENT DOCUMENTS

| | | | |
|---|---|---|---|
| 2013/0200903 A1* | 8/2013 | Labbe | G01R 31/3606 324/437 |
| 2015/0204912 A1* | 7/2015 | Wade | H01M 10/48 324/437 |

FOREIGN PATENT DOCUMENTS

| | | |
|---|---|---|
| DE | 102007027916 A1 | 3/2008 |
| DE | 102006054369 A1 | 5/2008 |
| DE | 102008006866 A1 | 8/2009 |
| WO | 2008037724 A1 | 4/2008 |

* cited by examiner

ARRANGEMENT OF AN ELECTRONIC SENSOR DEVICE AT A TERMINAL POST CLAMP OF A BATTERY AND A METHOD FOR PRODUCING SUCH AN ARRANGEMENT

CROSS REFERENCE

This application claims priority to German Patent Application No. 10 2013 104756.4 filed May 8, 2013, and hereby incorporates this document by reference.

BACKGROUND

The present invention relates to an arrangement of an electronic sensor device at a terminal post clamp of a battery and a method for producing such an arrangement.

An arrangement and a method of the aforementioned kind are known from the DE 10 2005 043 320 A1. The arrangement that is described in said German patent is connected to a battery in a motor vehicle. In this case the electronic sensor device is designed as a current sensor. A screw and a nut are used as the fastening means for the connection between the terminal post clamp and the housing of the electronic sensor device. A tab, which is mounted on the terminal post clamp, can be connected by means of said screw and nut to a tab that is mounted on the housing. An additional screw connection is provided between the cable harness of the motor vehicle and the housing, so that the screw that is used in this case can also be screwed into a holding section of the battery. The screw connections fulfill the objective of holding the housing of the electronic sensor device in a mechanical fashion and, in so doing, also lend themselves to absorbing the torque caused by externally applied forces while the vehicle is moving.

The drawbacks with a device of the above described type are the screw connections that can be implemented only with the use of screws and nuts. Such a connection requires during assembly not only additional components but also additional production steps. As a result, it has turned out that a torque support at the housing of the electronic sensor device cannot be provided in the state of the art without additional components, such as screws, rivets or the like.

SUMMARY OF THE INVENTION

The problem, on which the present invention is based, is to provide an arrangement of the type described in the introductory part of the specification in such a way that a secure and reliable connection of the electronic sensor device to the terminal post clamp with simple and cost effective means is guaranteed. Furthermore, the object of the present invention is to provide a method for producing such an arrangement.

This engineering object with respect to the arrangement is achieved in accordance with the invention by means of an arrangement of the type that is described in the introductory part of the specification, where this arrangement exhibits the characterizing features disclosed in patent claim 1; and this engineering object with respect to the method is achieved in accordance with the invention by means of a method exhibiting the features disclosed in patent claim 9. The dependent claims relate to preferred embodiments of the invention.

The fastening means may comprise a receptacle and a fastening member that can be inserted at least in sections into the receptacle in a positive locking and/or non-positive locking manner. The receptacle and the fastening member that is accommodated in said receptacle can also be used as the torque support and, as a result, can guarantee a secure and reliable mechanical connection of the housing of the electronic sensor device to the terminal post clamp. In particular, this arrangement makes it possible to dispense with additional components, such as screws, rivets or bolts. Furthermore, there is also no need for additional production steps.

There is the possibility of arranging the receptacle on the housing and of arranging the fastening member on the terminal post clamp; or there is the possibility of arranging the receptacle on the terminal post clamp and of arranging the fastening member on the housing.

It can be provided that the fastening member is designed as a projection or as a projecting contour of the terminal post clamp or of the housing respectively. The generation of such structures can be easily integrated into the production process.

There is the possibility of constructing the fastening member in one piece with the terminal post clamp or in one piece with the housing respectively. This strategy cuts the cost of an additional production step for generating the fastening member.

It can be provided that the receptacle is constructed in the manner of a pocket. Such a design of the receptacle allows the fastening member to be inserted in a simple way and guarantees that the fastening member is held in the receptacle in a positive locking and non-positive locking manner.

There is the possibility of constructing the receptacle in one piece with the housing or in one piece with the terminal post clamp respectively. This strategy cuts the cost of an additional production step for generating the housing.

It can be provided that the housing with the receptacle, which is mounted on said housing, or with the fastening member, which is mounted on said housing, is a one piece injection molded part. This feature makes it very easy to fabricate the housing with the fastening means that are mounted on said housing.

There is the possibility that in the mounted state of the arrangement on the battery, the terminal post clamp has a plate-shaped region, which covers at least partially the side of the housing that faces away from the battery. In particular, the fastening member and the receptacle respectively are arranged in the plate-shaped region of the terminal post clamp; or the fastening member and the receptacle respectively are a part of the plate-shaped region of the terminal post clamp. By covering the side that faces away from the battery or more specifically by covering typically the top side of the housing, the sensitive electronic sensor device is protected against damage in the installed state. For example, this is the case when a user mounts the terminal post clamp on the post of the battery by means of an impact tool. In this context the fastening member can be, for example, a part of the plate-shaped region that protrudes from this region in the manner of a tab.

In addition to the mechanical connection between the housing and the terminal post clamp, an electrically conductive connection between the terminal post clamp and a connector of the electronic sensor device can be provided. The electronic sensor device can have additional connectors, for instance, for open loop control leads and/or closed loop control leads and/or measuring leads as well as for the second battery post. The electronic sensor device can comprise at least one measuring resistor and may be used, for example, as a current sensor and/or also as a temperature sensor or voltage sensor.

The arrangement according to the invention can be mounted on the battery post of a motor vehicle. However, there is certainly also the possibility of mounting the inventive arrangement on other types of batteries.

In one embodiment, the method may provide the following steps:

the fastening member is inserted into the receptacle;
an electrically conductive connection is generated between one section of the terminal post clamp and a connector of the electronic sensor device.

The process of inserting the fastening member into the receptacle fulfills the objective of providing a secure and reliable mechanical connection between the terminal post clamp and the housing with simple means. Additional production steps for the purpose of mechanically connecting the electronic sensor device to the terminal post clamp are not necessary. The additional electrically conductive connection is also necessary in the state of the art.

At the same time it can be provided that a welded joint between one section of the terminal post clamp and a connector of the electronic sensor device is generated as the electrically conductive connection. In this case the welded joint is arranged, in particular, on the side of the housing that faces away from the receptacle or the fastening member respectively. A joint that is made by welding produces a secure and reliable connection between the terminal post clamp and the electronic sensor device even in the event of high currents.

These aspects are merely illustrative of the innumerable aspects associated with the present invention and should not be deemed as limiting in any manner. These and other aspects, features and advantages of the present invention will become apparent from the following detailed description when taken in conjunction with the referenced drawings.

BRIEF DESCRIPTION OF THE DRAWINGS

Reference is now made more particularly to the drawings, which illustrate the best presently known mode of carrying out the invention and wherein similar reference characters indicate the same parts throughout the views.

DETAILED DESCRIPTION

In the following detailed description numerous specific details are set forth in order to provide a thorough understanding of the invention. However, it will be understood by those skilled in the art that the present invention may be practiced without these specific details. For example, the invention is not limited in scope to the particular type of industry application depicted in the figures. In other instances, well-known methods, procedures, and components have not been described in detail so as not to obscure the present invention.

Figure 1:
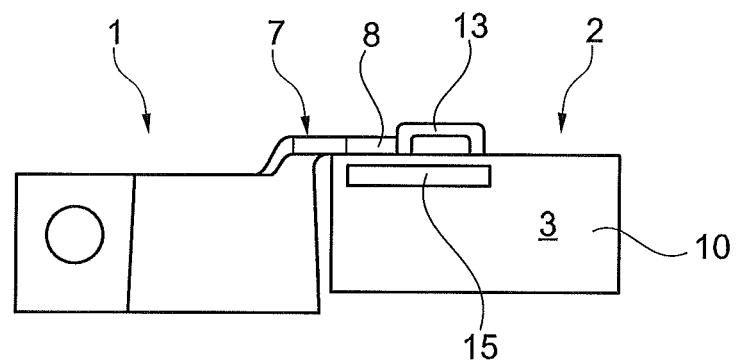
FIG. 1: in schematic form a side view of an arrangement in accordance with the invention.

The exemplary embodiments depicting the arrangement in accordance with the invention comprise a terminal post clamp 1 for a first post of a battery, which is not illustrated, and a housing module 2 for an electronic sensor device 3. The electronic sensor device 3 can exhibit, in particular, a measuring resistor 15, which is shown in schematic form in FIG. 1, or a shunt respectively.

The exemplary embodiments that are shown can relate, in particular, to an arrangement that comprises a terminal post clamp for the purpose of attaching to a battery of a motor vehicle.

Figure 4:
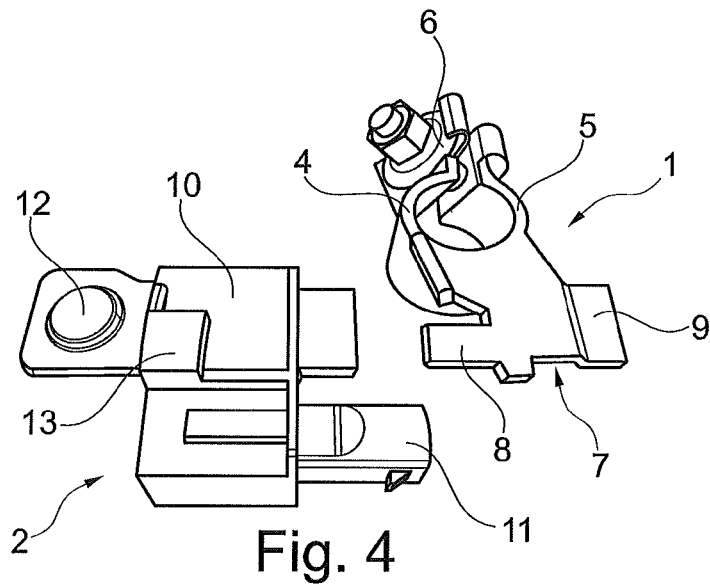
FIG. 4: a perspective view of an inventive arrangement in a state, in which the housing and the terminal post clamp are not connected to each other.

The terminal post clamp 1 comprises in a manner known from the prior art two clamping jaws 4, 5, which surround the terminal post of a battery and can be fixed to said battery terminal post with a screw connection 6 (see FIG. 4). Furthermore, the terminal post clamp 1 comprises a plate-shaped region 7 that projects away from the clamping jaws 4, 5. In this case, when the terminal post clamp 1 is in the mounted state on the battery, the plate-shaped region 7 is arranged on the top side or more specifically on the side of the terminal post clamp 1 that faces away from the battery.

Figure 2:
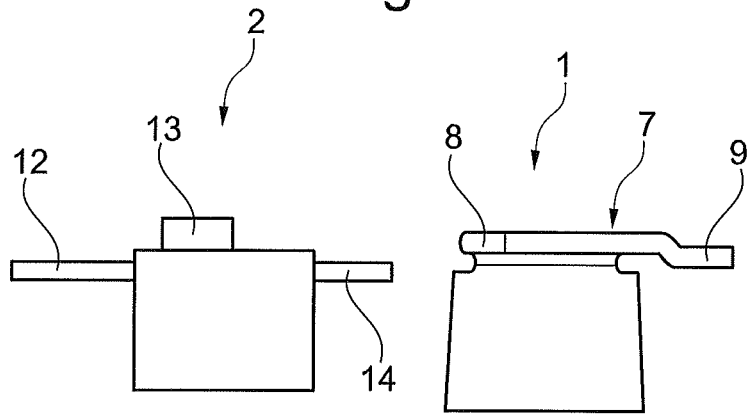
FIG. 2: in schematic form a side view of an arrangement from FIG. 1 that is rotated by 90° and is in a state, in which the housing and the terminal post clamp are not connected to each other.

A fastening element 8 is constructed on the plate-shaped region 7; and this fastening element projects away from the terminal post clamp 1 to the left in FIG. 2 and FIG. 4 in the form of a lug. On the side of the plate-shaped region 7 that faces away from the fastening element 8 there is a contact lug 9, which is displaced downwards in relation to the plate-shaped region 7.

The terminal post clamp 1 can be made from metal as a one piece part, in particular, as far as up to the screw connection 6.

The housing module 2 comprises a housing 10, which surrounds the electronic sensor device 3, with connectors 11, 12, which are mounted on said housing, for open loop control leads and/or closed loop control leads and/or measuring leads as well as for a ground lead to the chassis of the motor vehicle. A pocket-shaped receptacle 13 is mounted on the top side or more specifically on the side of the housing 10 that faces away from the battery. This pocket-shaped receptacle has an opening on the side that faces the terminal post clamp 1 in FIG. 2, for the purpose of inserting the fastening element 8. The housing 10 can be, together with the pocket-shaped receptacle 13, a one piece part, in particular a plastic injection molded part.

On the side of the housing 10 that faces the terminal post clamp 1 in FIG. 2 a lug-shaped connector 14, which is connected to the electronic sensor device 3, is mounted on said housing for the purpose of making contact with the terminal post clamp 1.

Figure 5:
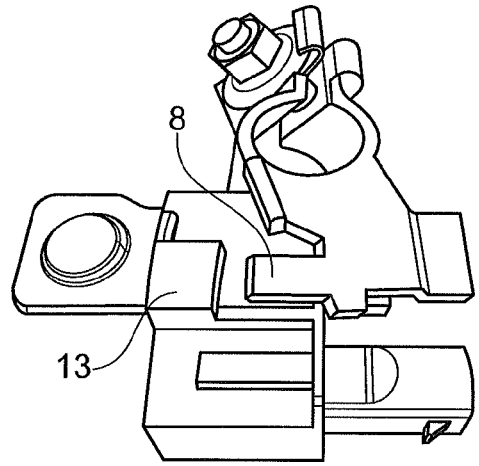
FIG. 5: a view, according to FIG. 4, in the course of inserting the fastening member into the receptacle.

FIG. 5 shows the arrangement in the course of inserting the fastening member 8 into the receptacle 13. It has been demonstrated that the objective of a mechanical connection of the terminal post clamp 1 to the housing 10 can be fulfilled by means of a simple sliding motion. FIG. 3, FIG. 6, FIG. 7 and FIG. 8 show in each instance the arrangement in the state, in which the housing 10 and the terminal post clamp 1 are connected to each other.

Figure 6:
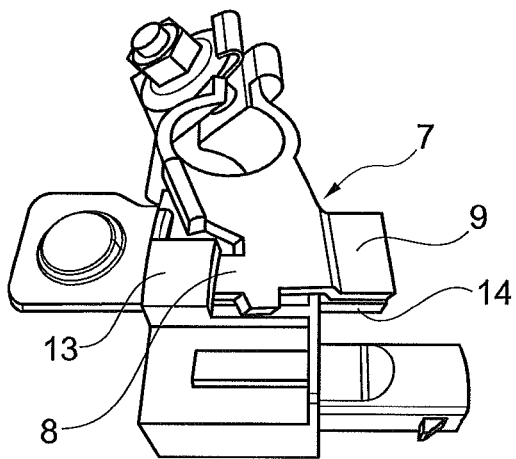
FIG. 6: a view, according to FIG. 4, in a state, in which the housing and the terminal post clamp are connected to each other.
Figure 7:
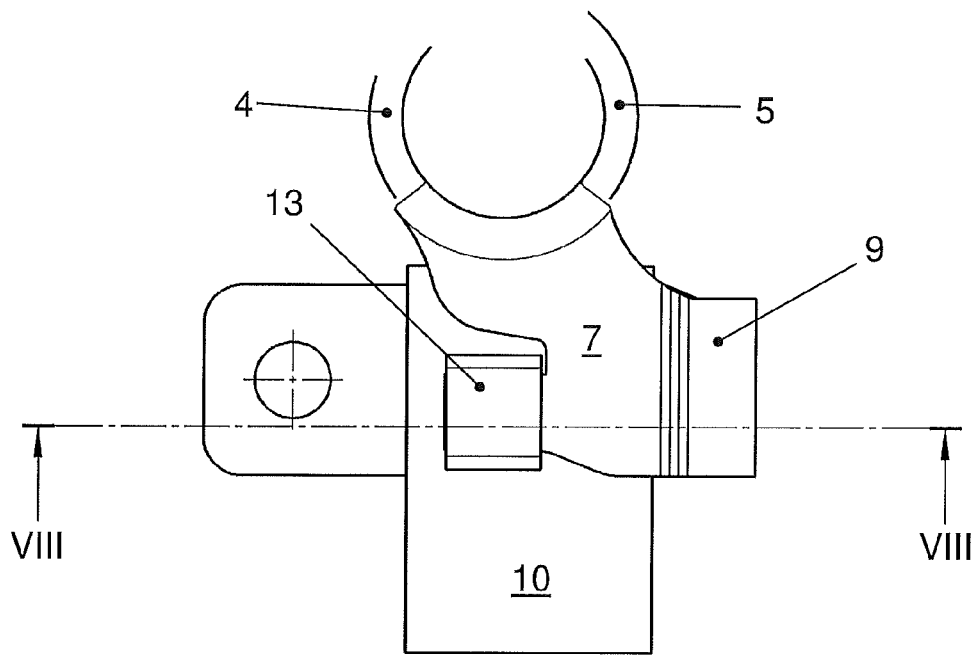
FIG. 7: in schematic form a top view of the arrangement in a state, in which the housing and the terminal post clamp are connected to each other.

In this state the fastening element 8 is completely inserted into the pocket-shaped receptacle 13 and is held in said pocket-shaped receptacle in a positive locking manner or non-positive locking manner respectively. Furthermore, FIG. 6 and FIG. 7 show, in particular, that the plate-shaped region 7 of the terminal post clamp 1 largely covers the top side of the housing 10 and, in so doing, protects against damage.

Figure 3:
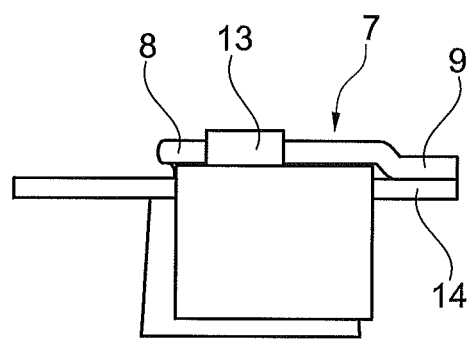
FIG. 3: a side view, according to FIG. 2, in a state, in which the housing and the terminal post clamp are connected to each other.
Figure 8:
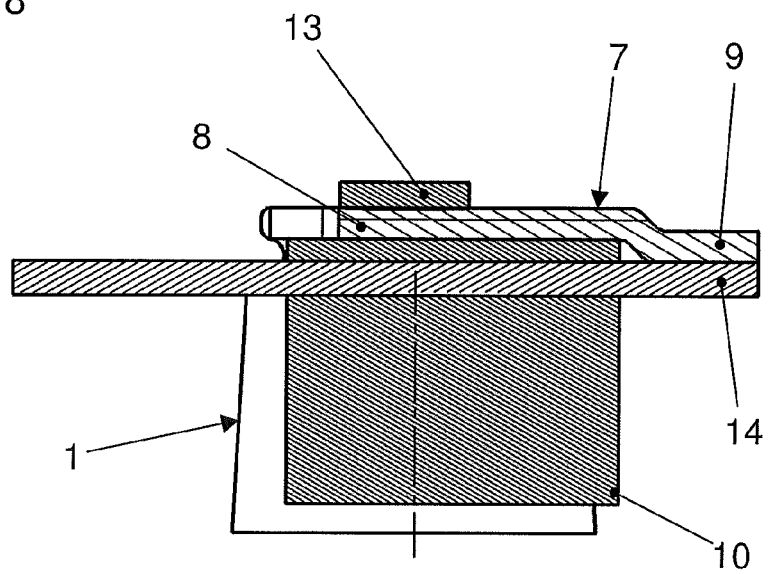
FIG. 8: a sectional view along the arrows VIII-VIII in FIG. 7.

In particular, FIG. 3 and FIG. 8 show that following insertion of the fastening element 8 into the receptacle 13, the contact lug 9 of the terminal post clamp 1 rests on the lug-shaped connector 14. Following insertion of the fastening element 8 into the receptacle 13, the contact lug 9 and the connector 14 are welded to each other, in order to fulfill the objective of electrically connecting the terminal post clamp 1 to the electronic sensor device 3.

As an alternative, there is the possibility of connecting the contact lug 9 and the connector 14 to each other by hard soldering or soldering and clinching respectively.

LIST OF REFERENCE NUMERALS 1 terminal post clamp
2 housing module
3 electronic sensor device
4 clamping jaw
5 clamping jaw
6 screw connection
7 plate-shaped region
8 fastening element
9 contact lug
10 housing
11 connector for open loop control leads and/or closed loop control leads and/or measuring leads
12 connector for a ground lead
13 receptacle
14 connector

The invention claimed is:

1. An arrangement of an electronic sensor device comprising:
  a terminal post clamp of a battery, said terminal post clamp including a fastening member extending outwardly from the terminal post clamp and formed integrally with the terminal post clamp;
  an electronic sensor device;
  a housing, which can accommodate the electronic sensor device, said housing including a receptacle, said receptacle sized and shaped to selectively receive the fastening member of the terminal post clamp, wherein said receptacle is formed integrally with said housing;
  and wherein the fastening member can connect the housing to the terminal post clamp; and
  wherein at least a portion of the fastening member can be inserted into the receptacle in at least one of a positive locking and a non-positive locking manner.

2. The arrangement as claimed in claim 1, wherein the fastening member is designed as a projection or as a projecting contour of the terminal post clamp.

3. The arrangement as claimed in claim 1, wherein the fastening member is constructed in one piece with the terminal post clamp.

4. The arrangement as claimed in claim 1, wherein the receptacle is constructed in the manner of a pocket.

5. The arrangement as claimed in claim 1, wherein the receptacle is constructed in one piece with the housing.

6. The arrangement as claimed in claim 1, wherein the housing with the receptacle, which is mounted on said housing, is a one piece injection molded part.

7. The arrangement as claimed in claim 1, wherein in the mounted state of the arrangement on the battery, the terminal post clamp has a plate-shaped region, which covers at least partially the side of the housing that faces away from the battery, wherein, in particular, the fastening member and the receptacle respectively are arranged in the plate-shaped region of the terminal post clamp or are a part of the plate-shaped region of the terminal post clamp.

8. A method for producing the arrangement of claim 1 comprising the following steps:
  inserting the fastening member into the receptacle;
  generating an electrically conductive connection between one section of the terminal post clamp and a connector of the electronic sensor device.

9. The method as claimed in claim 8, wherein a welded joint between one section of the terminal post clamp and a connector of the electronic sensor device is generated as the electrically conductive connection, wherein the welded joint is arranged, in particular, on the side of the housing that faces away from the receptacle.

10. An arrangement of an electronic sensor device comprising:
  a terminal post clamp of a battery, said terminal post clamp including a receptacle formed integrally with said terminal post clamp;
  an electronic sensor device;
  a housing, which can accommodate the electronic sensor device, said housing including a fastening member extending outwardly from the housing and formed integrally with the housing;
  said receptacle being sized and shaped to selectively receive the fastening member of the housing;
  wherein the fastening member can connect the housing to the terminal post clamp; and
  wherein at least a portion of the fastening member can be inserted into the receptacle in at least one of a positive locking and a non-positive locking manner.

11. The arrangement as claimed in claim 10, wherein the fastening member is designed as a projection or as a projecting contour of the housing.

12. The arrangement as claimed in claim 10, wherein the fastening member is constructed in one piece with the housing.

13. The arrangement as claimed in claim 10, wherein the receptacle is constructed in the manner of a pocket.

14. The arrangement as claimed in claim 10, wherein the receptacle is constructed in one piece with the terminal post clamp.

15. The arrangement as claimed in claim 10, wherein the housing with the fastening member, which is mounted on said housing, is a one piece injection molded part.

16. The arrangement as claimed in claim 10, wherein in the mounted state of the arrangement on the battery, the terminal post clamp has a plate-shaped region, which covers at least partially the side of the housing that faces away from the battery, wherein, in particular, the fastening member and the receptacle respectively are arranged in the plate-shaped region of the terminal post clamp or are a part of the plate-shaped region of the terminal post clamp.

17. A method for producing the arrangement of claim 10 comprising the following steps:
  inserting the fastening member into the receptacle;
  generating an electrically conductive connection between one section of the terminal post clamp and a connector of the electronic sensor device.

18. The method as claimed in claim 17, wherein a welded joint between one section of the terminal post clamp and a connector of the electronic sensor device is generated as the electrically conductive connection, wherein the welded joint is arranged, in particular, on the side of the housing that faces away from the fastening member.

* * * * *